United States Patent
Yokoyama et al.

(10) Patent No.: US 6,654,218 B1
(45) Date of Patent: Nov. 25, 2003

(54) PROTECTION CIRCUIT MODULE FOR RECHARGEABLE BATTERY AND METHOD OF MAKING THE SAME

(75) Inventors: Eiji Yokoyama, Kyoto (JP); Keigo Nakamura, Kyoto (JP); Naoya Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/937,141

(22) PCT Filed: Mar. 21, 2000

(86) PCT No.: PCT/JP00/01717
§ 371 (c)(1),
(2), (4) Date: Sep. 21, 2001

(87) PCT Pub. No.: WO00/57508
PCT Pub. Date: Sep. 28, 2000

(30) Foreign Application Priority Data

Mar. 24, 1999 (JP) ............................................. 11-078914
Apr. 26, 1999 (JP) ............................................. 11-117552

(51) Int. Cl.[7] ............................. H02H 3/18; H05K 7/02; H05K 1/18
(52) U.S. Cl. ........................... 361/78; 361/78; 361/811; 361/761
(58) Field of Search ............................ 361/78, 20, 220, 361/216, 217, 120, 112, 18, 128, 811, 761, 760, 762

(56) References Cited

U.S. PATENT DOCUMENTS

| | | | | |
|---|---|---|---|---|
| 5,982,628 A | * | 11/1999 | Houdeau et al. | 361/760 |
| 6,025,995 A | * | 2/2000 | Marcinkiewicz | 361/760 |
| 6,097,080 A | * | 8/2000 | Nakanishi et al. | 257/659 |
| 6,163,461 A | * | 12/2000 | Watanabe | 361/760 |
| 6,330,165 B1 | * | 12/2001 | Kohjiro et al. | 361/760 |

FOREIGN PATENT DOCUMENTS

| | | | |
|---|---|---|---|
| JP | 08-148597 | 6/1996 | ........... H01L/23/04 |
| JP | 09-130980 | 5/1997 | ............. H02J/7/00 |
| JP | 10-308414 | 11/1998 | ........... H01L/21/60 |
| JP | 11-017106 | 1/1999 | ........... H01L/25/16 |

* cited by examiner

Primary Examiner—Gregory J. Toatley, Jr.
Assistant Examiner—Danny Nguyen
(74) Attorney, Agent, or Firm—Michael D. Bednarek; Shaw Pittman LLP

(57) ABSTRACT

A circuit board (1) is provided upon which a predetermined number of semiconductor elements (5a, 5b, 6), including at least a field-effect transistor for charge and discharge, are mounted. A predetermined number of passive elements (7, 8a~8c, 9a~9g) are also mounted onto the circuit board. The semiconductor elements (5a, 5b, 6) are mounted facedown as bare chips on the circuit board (1).

5 Claims, 3 Drawing Sheets

PROTECTION CIRCUIT MODULE FOR RECHARGEABLE BATTERY AND METHOD OF MAKING THE SAME

TECHNICAL FIELD

The present invention relates to a protection circuit module for a rechargeable battery, and also to a method of making the same.

BACKGROUND ART

A rechargeable battery pack, which may be provided with a lithium-ion cell, incorporates a protection circuit to prevent overcharge.

FIG. 5 shows a conventional protection circuit module used for such a protective purpose. It includes a circuit board 51 having a main board portion 51a and a protrusion 51b projecting from a corner of the main board portion 51a. The circuit board 51 carries conductive plates 52, 53 soldered thereto at their one ends. These plates will be electrically connected to the anode or cathode of a rechargeable lithium-ion battery (not shown) with or without an intermediate connector. The circuit board 51 is provided with a wiring pattern (not shown) and a terminal base 54. Various electronic parts are mounted on the board to constitute the protection circuit. The terminal base 54 supports conductive plates 54a~54d serving as power input/output terminals through which power is taken in or out from the battery pack. The above-mentioned electronic parts include field-effect transistors 55a, 55b and a control IC (integrated circuit) 56 as semiconductor elements, and a plurality of passive elements 57a~57k. The passive elements 57a~57k may be a resistor, capacitor, or thermistor for example. The field-effect transistors 55a, 55b and the control IC 56 each have a resin package from which electrical leads project to be soldered to the circuit board 51.

The conductive plate 52 is connected to the conductive plate 54a via the wiring pattern on the circuit board 51, while the conductive plate 53 is connected to the conductive plate 54a via the wiring pattern on the board 51 and the field-effect transistors 55a, 55b mounted on the board 51.

Unfavorably, the conventional design has the following drawbacks since the transistors 55a, 55b and IC 56 mounted on the circuit board 51 are resin-packaged.

First, the on-resistance of the field-effect transistors 55a, 55b cannot be reduced to a desired level. Specifically, in the packaged components, use is made of a wire for bonding a bare chip to an electrical lead. Since the bonding wire has a certain resistance, the on-resistance may fail to be rendered satisfactorily small. Accordingly, the power loss fails to be restricted to a low level. One solution to address this problem may be to use a plurality of wires arranged in parallel for performing the wire-bonding. In this manner, though the on-resistance can be reduced to some extent, the production costs will unduly increase.

Second, the size of the resin package is much larger than that of a bare chip. Accordingly, the protection circuit module, and hence the battery pack, cannot be downsized to a desire level.

Third, in a typical protection circuit module, the component-mounted circuit board 51 as a whole is usually coated with protective resin for water resistance. However, since the field-effect transistors 55a, 55b and the control IC 56 are initially provided with a protective resin package of their own, the second resin coating may be superfluous, merely to incur an increase in the production cost.

Fourth, the resin-packaged field-effect transistors 55a, 55b and the control IC 56 are more expensive than the bare chips. Accordingly, the production cost of the conventional protection circuit module is made greater.

Additionally, in the conventional layout, the conductive plates 52 and 54a are electrically directly connected to each other. Despite of this, the conductive plate 52 is first soldered to the circuit board 51 and then connected to the conductive plate 54a via the wiring pattern formed on the circuit board 51. Due to this, extra room for fixing the conductive plate 52 or providing the wiring pattern is needed, whereby the circuit board is made unduly large. This hinders the size and weight reduction of the battery pack. Also, the reduction in production cost may not be readily achieved since one additional step is needed to attach the conductive plate 52 to the circuit board 51.

DISCLOSURE OF THE INVENTION

The present invention has been proposed for overcoming or alleviating the problem entailed in the above-noted conventional design. It is, therefore, an object of the present invention to provide a protection circuit module for a rechargeable battery whereby the on-resistance of a field-effect transistor is advantageously reduced, and whereby the thickness, overall size, weight and production costs of the rechargeable battery pack are also reduced. Another object is to provide a method of making such a protection circuit module.

According to a first aspect of the present invention, there is provided a protection circuit module for a rechargeable battery. The module includes: a circuit board; a predetermined number of semiconductor elements including at least a field-effect transistor mounted on the circuit board for charge and discharge; and a predetermined number of passive elements mounted on the circuit board. The semiconductor elements are mounted facedown as bare chips onto the circuit board.

Preferably, the semiconductor elements and the passive elements are enclosed by a protection coating.

According to a second embodiment, there is provided a method of making a protection circuit module for a rechargeable battery, where the module includes: a circuit board; a predetermined number of semiconductor elements including at least a field-effect transistor mounted on the circuit board for charge and discharge; and a predetermined number of passive elements mounted on the circuit board. Bare chips having solder bumps are used for the semiconductor elements, and these bare chips together with the passive elements are simultaneously mounted on the circuit board by solder reflowing.

According to the first and second aspects of the present invention, the bare chip semiconductor elements are mounted facedown on the circuit board. In this manner, the on-resistance of the field-effect transistor can be properly reduced. At the same time, it is possible to reduce the thickness, overall size and production cost of a rechargeable battery pack.

More specifically, since the bare chip of the field-effect transistor is directly mounted on the circuit board, the resistance of bonding wires is omitted. Thus, the on-resistance of the field-effect transistor is properly reduced, which is advantageous to reducing the power loss. In addition, without using no packages, the protection circuit module can be made thinner and smaller. Accordingly, the rechargeable battery pack is also made thinner and smaller. Further, the bare chip is less expensive than the packaged product. Therefore, the protection circuit module for a rechargeable battery can be produced at a reduced cost.

Further, use is made of bare chips with solder bumps for the semiconductor elements, and these bare chips together with passive elements are mounted on the circuit board by solder reflowing. In this manner, it is possible to enjoy the above-noted advantages resulting from the direct mounting of the field effect transistor bare chips on the circuit board, and also to perform the soldering procedure very effectively. As a result, the production efficiency is improved, while the production cost is reduced.

According to a third embodiment of the present invention, there is provided a protection circuit module for a rechargeable battery. This module includes: a circuit board; a first conductive plate attached to the circuit board to be electrically connected to the rechargeable battery; a second conductive plate attached to the circuit board to be electrically connected to the first conductive plate; and a terminal base at which the second conductive plate is disposed as a terminal. The feature may reside in that the first conductive plate and the second conductive plate are integrated into a single conductive plate.

Preferably, the conductive plate may have one end disposed on the terminal base and another end projecting outward from the circuit board.

According to the third aspect of the present invention, use is made of a conductive plate integrating the first and the second conductive plates. Therefore, there is no need to provide extra room for fixing the first conduct plate to the circuit board or for forming the wiring pattern to connect the first and the second conductive plates. Accordingly, the circuit board is made smaller, and hence the size reduction or weight reduction of the rechargeable battery pack can be achieved. Further, no first conductive plate needs to be attached to the circuit board, which facilitates the reduction in production cost.

According to a fourth aspect of the present invention, there is provided a protection circuit module for a rechargeable battery. The module includes: a circuit board; a predetermined number of semiconductor elements including at least a field-effect transistor mounted on the circuit board for charge and discharge; a predetermined number of passive elements mounted on the circuit board; a first conductive plate attached to the circuit board to be electrically connected to the rechargeable battery; a second conductive plate attached to the circuit board to be electrically connected to the first conductive plate; and a terminal base at which the second conductive plate is disposed as a terminal. The first conductive plate and the second conductive plate are integrated into a single conductive plate. Also, the semiconductor elements are mounted facedown as bare chips onto the circuit board.

With such an arrangement, it is possible to enjoy the above-mentioned advantages resulting from the first and the third aspects of the present invention.

Other features and advantages of the present invention will become apparent from the detailed description given below with reference to the accompanying drawings.

BEST MODE FOR CARRYING OUT THE INVENTION

The preferred embodiments of the present invention will be described below with reference to FIGS. 1~4.

Figure 1:
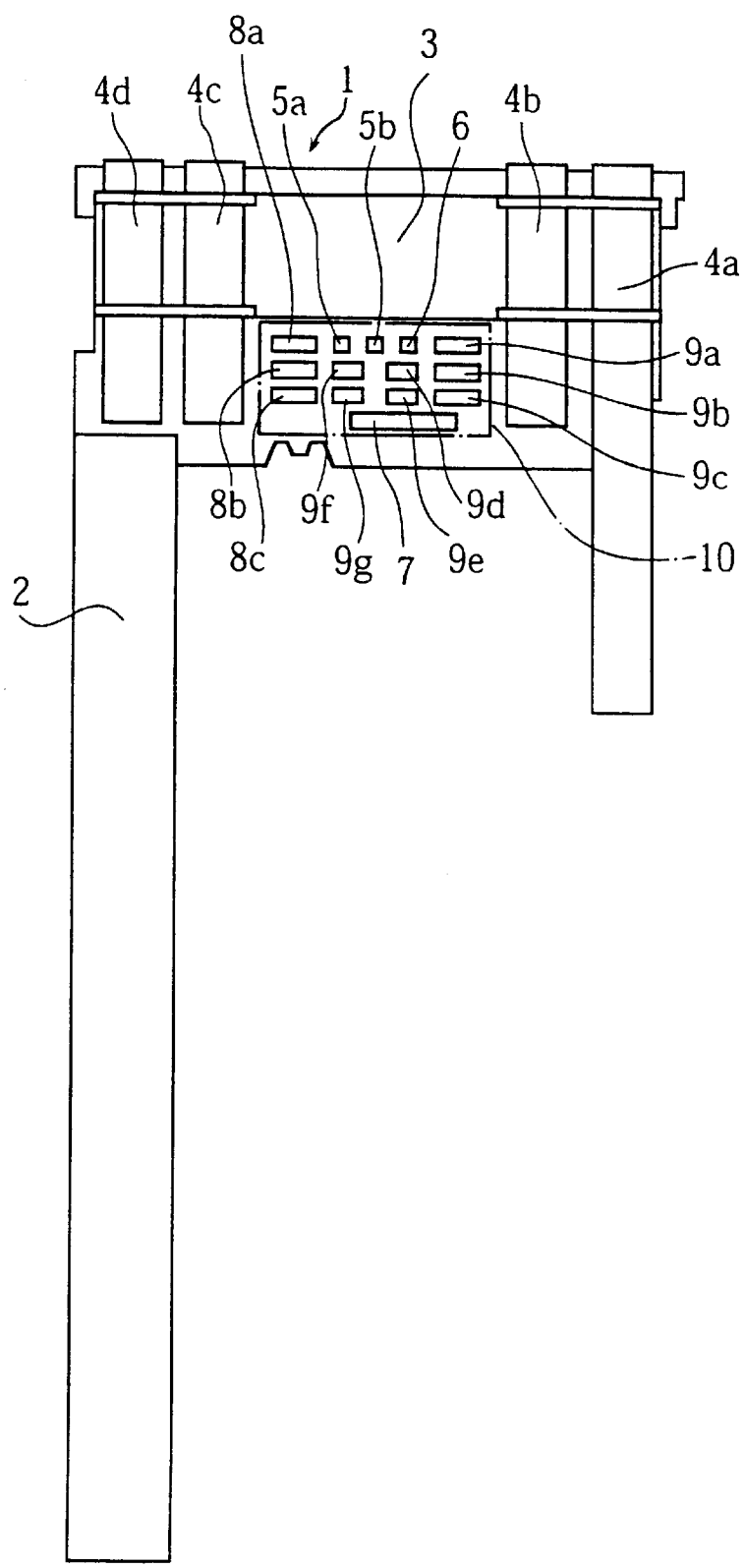
FIG. 1 is a schematic view showing the structure of a protection circuit module for a rechargeable battery according to a first embodiment of the present invention.

FIG. 1 is a schematic view showing the structure of a protection circuit module for a rechargeable battery according to a first embodiment of the present invention. The circuit board 1 has a corner to which one end of a conductive plate 2 may be soldered. This plate is brought into electrical connection to the anode or cathode of a rechargeable lithium-ion battery (not shown) with or without another conductive member. The conductive plate 2 is made of nickel for example. The circuit board 1 also carries a terminal base 3, field-effect transistors together with other electronic parts (not shown) constituting the protection circuit, and a wiring pattern (not shown) formed on the board. The terminal base 3 is provided with conductive terminal plates 4a~4d to take power into or out of the rechargeable battery pack.

The conductive plate 4a is in the form of a rectangular strip, and is longer than the other conductive plates 4b~4d. Its one end is located on the terminal base 3, while the other end projects away from the circuit board 1. The conductive plate 4a is a gold-plated nickel strip, which comes into electrical connection to the anode or cathode of the rechargeable lithium-ion battery (not shown) with or without another conductive member. The conductive plate 2 is connected to the conductive plate 4d via the field-effect transistors mounted on the circuit board 1 and the wiring pattern formed on the circuit board 1.

Semiconductor elements 5a, 5b, 6 and passive elements 7, 8a~8c, 9a~9g are mounted on the circuit board 1. The semiconductor elements 5a, 5b are bare chips functioning as field-effect transistors. The semiconductor element 6 is a bare chip functioning as a control IC. The passive element 7 is a thermistor. The passive elements 8a~8c are resistors. The passive elements 9a~9g are capacitors. These semiconductor elements 5a, 5b, 6 and the passive elements 7, 8a~8c, 9a~9g are covered with a resin protection coating 10.

Figure 2:
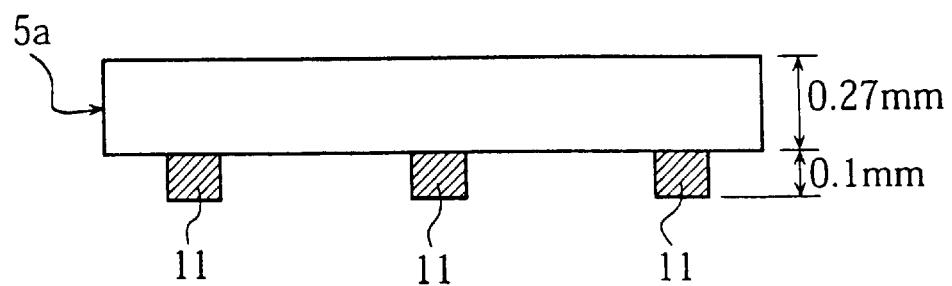
FIG. 2 is an enlarged front view showing a semiconductor device used in the protection circuit module shown in FIG. 1.

FIG. 2 is a front view showing the semiconductor element 5a. The semiconductor element 5a or bare chip as a field-effect transistor is provided with a plurality of solder bumps 11. The thickness of the bare chip is 0.27 mm, while the thickness of the solder bump 11 is 0.1 mm. The same dimensional relation applies to the semiconductor element 5b and the semiconductor element 6. The solder bumps 11 serve as source, drain and gate electrodes, respectively. Each of the solder bumps 11 is made of solder material having a high melting point that contains 96% lead and 4% tin by weight.

The semiconductor elements 5a, 5b and the semiconductor element 6, together with the passive element 7, the passive elements 8a~8c and the passive elements 9a~9g, are mounted facedown onto the circuit board 1 by solder reflowing via the solder bumps 11. Thereafter, the protection coating 10 is formed to enclose the semiconductor elements 5a, 5b, 6 and the passive elements 7, 8a~8c, 9a~9g. The protection coating 10 prevents the penetration of liquid leaking from the rechargeable battery or moisture coming from the outside of the electronic apparatus.

Figure 5:
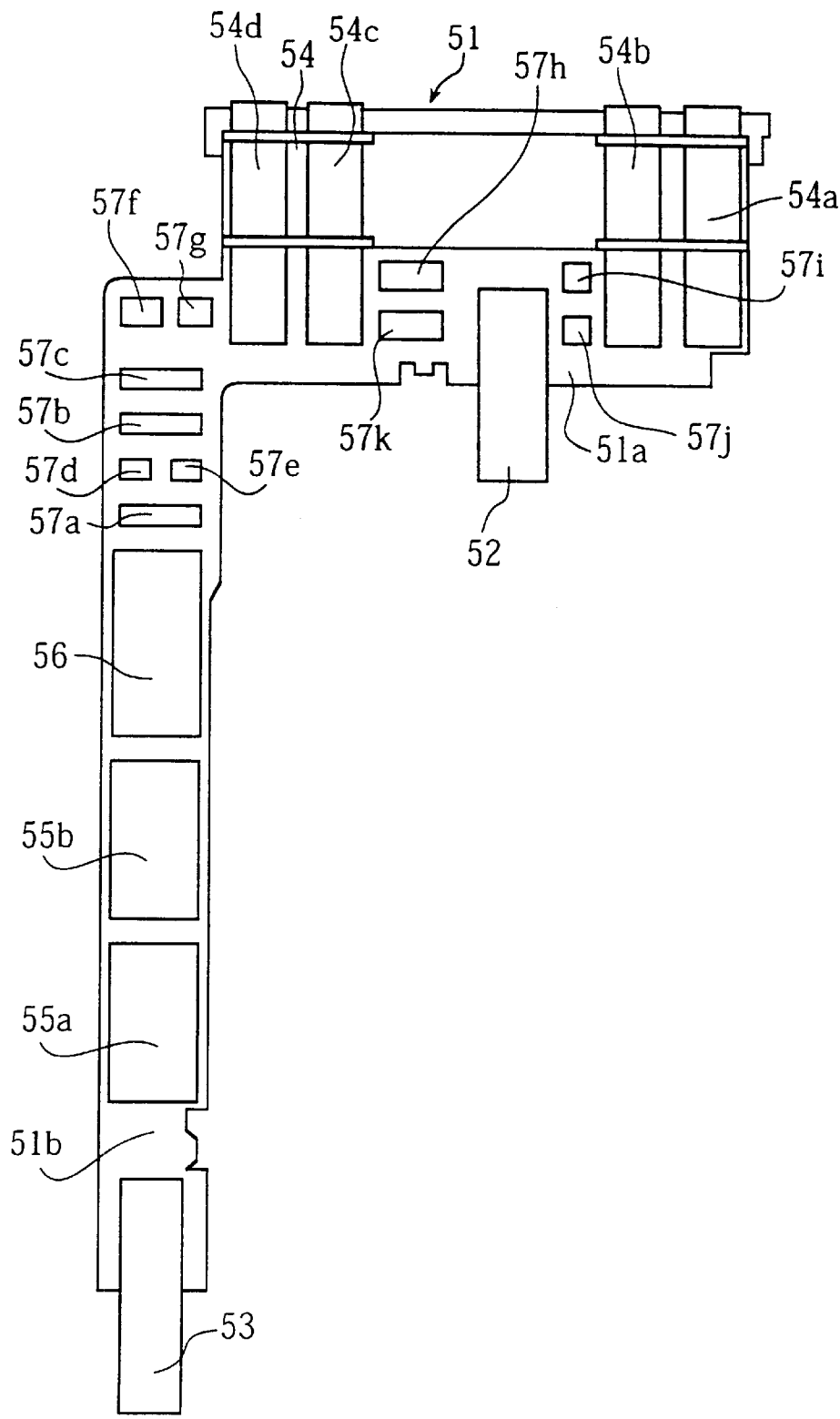
FIG. 5 is a schematic view showing the structure of a conventional protection circuit module used for a rechargeable battery.

In the above-described protection circuit module for a rechargeable battery, use is made of the conductive plate 4a which corresponds to the integrated assembly of the conventional conductive plates 52 and 54a shown in FIG. 5. Thus, no additional space is needed on the circuit board 51 for the connection of the conductive plate 52, and no additional room is required for forming a wiring pattern to connect the conductive plate 52 to the conductive plate 54a. Accordingly, the circuit board 1 is reduced in size, which is advantageous to reducing the size and weight of the rechargeable battery pack. Further, the production cost is advantageously reduced since no additional step is required to attach the conductive plate 52 to the circuit board 51.

As noted above, the semiconductor elements 5a, 5b and the semiconductor element 6, as bare chips, are mounted facedown on the circuit board 1. In this manner, it is possible to satisfactorily reduce the on-resistance of the field-effect transistors or semiconductor elements 5a, 5b. Differing from a resin-packaged device, there is no need to connect a bare chip to a lead terminal via a gold wire. Since the resistance of a wire is not involved, the on-resistance of the field-effect transistor is advantageously reduced, which serves to alleviate power loss. Moreover, since the bare chip is much smaller than the resin-packaged product, the protection circuit module can be made thinner and smaller. Accordingly, it is possible to achieve the downsizing of the rechargeable battery pack. Also, since the bare chip is less expensive than the packaged product, the production cost is advantageously reduced. Needless to say, the semiconductor bare chip elements 5a, 5b, 6 are fully protected without employing a resin package of their own since the semiconductor elements 5a, 5b and 6, together with the passive elements 7, 8a~8c and 9a~9g, are enclosed by the protection coating 10.

Figure 3:
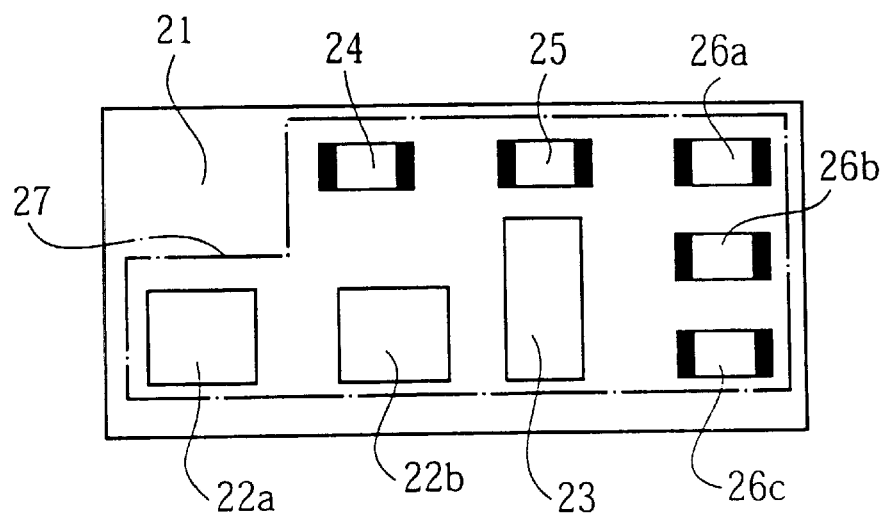
FIG. 3 is a plan view showing a circuit board used in a protection circuit module for a rechargeable battery according to a second embodiment of the present invention.
Figure 4:
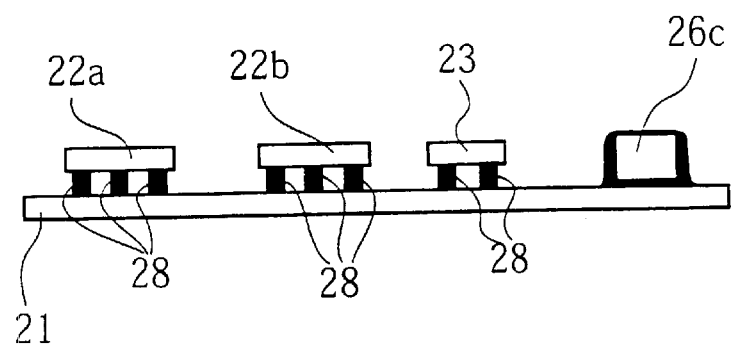
FIG. 4 is a front view showing the circuit board shown in FIG. 3.

FIG. 3 is a plan view showing a circuit board of a protection circuit module for a rechargeable battery according to a second embodiment of the present invention, and FIG. 4 is a front view of it. In this embodiment, no terminal base 3 is used. The circuit board 21 carries semiconductor elements 22a and 22b, a semiconductor element 23, a passive element 24, a passive element 25, and passive elements 26a~26c. The semiconductor elements 22a, 22b are bare chips functioning as field-effect transistors. The semiconductor element 23 is a bare chip functioning as a control IC. The passive element 24 is a thermistor. The passive element 25 is a resistor. The passive elements 26a~26c are capacitors. The semiconductor elements 22a, 22b, 23 and the passive elements 24, 25, 26a~26c are enclosed by a resin protection coating 27.

The semiconductor elements 22a, 22b and the semiconductor element 23, together with the passive elements 24, 25 and 26a~26c, are mounted facedown onto the circuit board 21 by solder reflowing via solder bumps 28. After the mounting step, the protection coating 27 is formed to enclose the semiconductor elements 22a, 22b, 23 and the passive elements 24, 25, 26a~26c. The protection coating 27 prevents the penetration of liquid leaking from the rechargeable battery or moisture coming from the outside of the electronic apparatus.

Due to the omission of the terminal base 3, the above embodiment is highly advantageous to achieving further reduction in thickness and overall size than the previous embodiment shown in FIGS. 1 and 2.

In the respective embodiments described above, use is made of a lithium-ion battery for a rechargeable power source. Other kinds of rechargeable batteries such as a lithium polymer battery ay also be usable.

What is claimed is:

1. A protection circuit module for a rechargeable battery, the module comprising:

a circuit board;

a plurality of semiconductor elements including a field-effect transistor for charge and discharge;

a plurality of passive elements;

a first pair of adjacent terminal plates attached to the circuit board;

a second pair of adjacent terminal plates attached to the circuit board and spaced from the first pair of terminal plates by a predetermined spacing; and a conductive plate attached to and projecting beyond an edge of the circuit board;

wherein one of the first pair of terminal plates is longer than any other terminal plates and projects beyond said edge of the circuit board;

wherein the semiconductor elements and the passive elements are all disposed in said spacing on the circuit board; and wherein the semiconductor elements are mounted facedown as bare chips on the circuit board.

2. The protection circuit module for a rechargeable battery according to claim 1, wherein all the semiconductor elements and the passive elements are collectively enclosed by a single protection coating disposed in said spacing.

3. The protection circuit module according to claim 1, further comprising a terminal base attached to the circuit board, wherein said one of the first pair of terminal plates projects from the terminal base beyond said edge of the circuit board.

4. A method of making a protection circuit module for a rechargeable battery, the module comprising: a circuit board; a plurality of semiconductor elements including a field-effect transistor for charge and discharge; a plurality of passive elements; a first pair of adjacent terminal plates attached to the circuit board;

a second pair of adjacent terminal plates attached to the circuit board and spaced from the first pair of terminal plates by a predetermined spacing; and a conductive plate attached to and projecting beyond an edge of the circuit board; wherein one of the first pair of terminal plates is longer than any other terminal plates and projects beyond said edge of the circuit board; the method comprising the steps of:

arranging all of the semiconductor elements and the passive elements in said spacing on the circuit board, the semiconductor elements being bare chips having solder bumps; and mounting the bare chips and the passive elements collectively on the circuit board by reflow soldering.

5. The method according to claim 4, further comprising the step of forming a protection coating for collectively enclosing all of the semiconductor elements and the passive elements.

* * * * *